(12) United States Patent
Li et al.

(10) Patent No.: US 8,291,299 B2
(45) Date of Patent: Oct. 16, 2012

(54) TURBO-EQUALIZATION METHODS FOR ITERATIVE DECODERS

(75) Inventors: Zongwang Li, San Jose, CA (US); Shaohua Yang, San Jose, CA (US); Yang Han, Santa Clara, CA (US); Hao Zhong, Milpitas, CA (US); Yuan Xing Lee, San Jose, CA (US); Weijun Tan, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/524,418

(22) PCT Filed: Apr. 2, 2009

(86) PCT No.: PCT/US2009/039279
§ 371 (c)(1),
(2), (4) Date: Jul. 24, 2009

(87) PCT Pub. No.: WO2010/101578
PCT Pub. Date: Sep. 10, 2010

(65) Prior Publication Data
US 2011/0311002 A1 Dec. 22, 2011

Related U.S. Application Data

(60) Provisional application No. 61/157,671, filed on Mar. 5, 2009.

(51) Int. Cl.
*H03M 13/00* (2006.01)
(52) U.S. Cl. ........ 714/774; 714/746; 714/752; 714/758; 714/780; 714/786; 714/790; 714/792; 714/794; 714/795

(58) Field of Classification Search .................. None
See application file for complete search history.

(56) References Cited

U.S. PATENT DOCUMENTS

| 6,307,901 B1 | 10/2001 | Yu et al. |
| 6,888,897 B1 | 5/2005 | Nazari et al. |
| 7,181,676 B2 | 2/2007 | Hocevar |
| 7,237,181 B2 | 6/2007 | Richardson |
| 7,340,671 B2 | 3/2008 | Jones et al. |
| 7,716,561 B2 * | 5/2010 | Belogolovyi et al. ......... 714/780 |

(Continued)

FOREIGN PATENT DOCUMENTS

WO WO03092170 A1 11/2003
(Continued)

OTHER PUBLICATIONS

Gunnam et al., "Technical MNote on Interative Solutions for Turbo Equalization", Jul. 2006.*

(Continued)

*Primary Examiner* — John Trimmings
(74) *Attorney, Agent, or Firm* — Mendelsohn, Drucker & Associates, P.C.; Craig M. Brown; Steve Mendelsohn (57) ABSTRACT

Certain embodiments of the present invention are improved turbo-equalization methods for decoding encoded codewords. In one embodiment, in global decoding iteration i, the magnitude values of all decoder-input LLR values ($L_{ch}$) are adjusted based on the number b of unsatisfied check nodes in the decoded codeword produced by global iteration i–1. The improved turbo-equalization methods can be used as the sole turbo-equalization method for a given global decoding session, or interleaved with other turbo-equalization methods.

25 Claims, 5 Drawing Sheets

U.S. PATENT DOCUMENTS

| | | | |
|---|---|---|---|
| 7,739,558 B1 | 6/2010 | Farjadrad et al. | |
| 7,752,523 B1 | 7/2010 | Chaichanavong et al. | |
| 7,805,642 B1 | 9/2010 | Farjadrad | |
| 7,895,500 B2 | 2/2011 | Sun et al. | |
| 7,904,793 B2 | 3/2011 | Mokhlesi et al. | |
| 7,941,737 B2 | 5/2011 | Gopalakrishnan et al. | |
| 8,010,869 B2* | 8/2011 | Wehn et al. | 714/758 |
| 8,046,658 B2* | 10/2011 | Heinrich et al. | 714/752 |
| 8,127,209 B1 | 2/2012 | Zhang et al. | |
| 8,151,171 B2 | 4/2012 | Blanksby | |
| 8,156,409 B2 | 4/2012 | Patapoutian et al. | |
| 2002/0062468 A1 | 5/2002 | Nagase et al. | |
| 2002/0166095 A1 | 11/2002 | Lavi et al. | |
| 2005/0193320 A1* | 9/2005 | Varnica et al. | 714/800 |
| 2005/0204255 A1 | 9/2005 | Yeh et al. | 714/780 |
| 2005/0283707 A1 | 12/2005 | Sharon et al. | |
| 2006/0107181 A1 | 5/2006 | Dave et al. | |
| 2006/0285852 A1 | 12/2006 | Xi et al. | 398/208 |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0089018 A1 | 4/2007 | Tang et al. | |
| 2007/0124652 A1 | 5/2007 | Litsyn et al. | |
| 2007/0147481 A1 | 6/2007 | Bottomley et al. | 375/341 |
| 2007/0153943 A1 | 7/2007 | Nissila | |
| 2007/0162788 A1 | 7/2007 | Moelker | |
| 2007/0220408 A1 | 9/2007 | Huggett et al. | |
| 2007/0234178 A1 | 10/2007 | Richardson et al. | |
| 2007/0234184 A1 | 10/2007 | Richardson | |
| 2008/0082868 A1 | 4/2008 | Tran et al. | |
| 2008/0104485 A1 | 5/2008 | Lyakh et al. | |
| 2008/0109701 A1 | 5/2008 | Yu et al. | 714/755 |
| 2008/0126910 A1 | 5/2008 | Venkatesan et al. | |
| 2008/0148129 A1 | 6/2008 | Moon | |
| 2008/0163032 A1 | 7/2008 | Lastras-Montano | |
| 2008/0235561 A1 | 9/2008 | Yang | 714/800 |
| 2008/0276156 A1 | 11/2008 | Gunnam et al. | |
| 2008/0301521 A1 | 12/2008 | Gunnam et al. | |
| 2009/0083609 A1* | 3/2009 | Yue et al. | 714/801 |
| 2009/0150745 A1 | 6/2009 | Langner et al. | |
| 2009/0235146 A1* | 9/2009 | Tan et al. | 714/780 |
| 2009/0273492 A1 | 11/2009 | Yang et al. | |
| 2009/0319860 A1 | 12/2009 | Sharon et al. | |
| 2010/0042806 A1 | 2/2010 | Gunnam | |
| 2010/0042890 A1 | 2/2010 | Gunnam | |
| 2010/0050043 A1 | 2/2010 | Savin | |

FOREIGN PATENT DOCUMENTS

| | | |
|---|---|---|
| WO | WO2004079563 A1 | 9/2004 |
| WO | WO2008004215 A2 | 1/2008 |
| WO | WO 2010/019168 A1 | 2/2010 |

OTHER PUBLICATIONS

Veliambi et al., "An Improved Decoding Algorithm for Low Density Parity-Check Codes over Binary Erasure Channel", IEEE Globecom, 2005.*

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. I5.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems—l: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, in Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981, pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Vellambi et al. "An Improved Decoding Algorithm for Low-Density Parity-Check Codes over the Binary Erasure Channel." IEEE Globecom [online], 2005 [retrieved on May 5, 2009], pp. 1182-1186.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Sripimanwat, K., "Turbo Code Applications: A Journey From a Paper to Realization", Oct. 26, 2005, Springer, p. 27.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Extended European Search Report; Mailed May 4, 2012 for corresponding EP Application No. EP 09805985.0.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

* cited by examiner

TURBO-EQUALIZATION METHODS FOR ITERATIVE DECODERS

CROSS-REFERENCE TO RELATED APPLICATIONS

This application claims the benefit of U.S. provisional application No. 61/157,671 filed on Mar. 5, 2009, the teachings of which are incorporated herein by reference in their entirety.

The subject matter of this application is related to (1) the subject matter of PCT application no. PCT/US08/86523 filed on Dec. 12, 2008, (2) the subject matter of PCT application no. PCT/US08/86537 filed on Dec. 12, 2008, and (3) the subject matter of U.S. application Ser. No. 12/401,116 filed on Feb. 10, 2009, the teachings of all of which are incorporated herein by reference in their entirety.

BACKGROUND OF THE INVENTION

1. Field of the Invention

The invention relates to digital signal processing, and, in particular, to a data-encoding method known as low-density parity check (LDPC) coding.

2. Description of the Related Art

Communication is the transmission of information by a transmitter to a receiver over a communications channel. In the real world, the communications channel is a noisy channel, providing to the receiver a distorted version of the information transmitted from the transmitter. A hard disk (HD) drive is one such noisy channel, accepting information from a transmitter, storing that information, and then providing a more or less distorted copy of that information to a receiver.

The distortion introduced by a communications channel, such as an HD drive, might be great enough to cause a channel error, i.e., where the receiver interprets the channel output signal as a 1 when the channel input signal was a 0, or vice versa. Channel errors reduce throughput, and are thus undesirable. Hence, there is an ongoing need for tools that detect and/or correct channel errors. Low-density parity check (LDPC) coding is one method for the detection and correction of channel errors.

LDPC codes are among the known near-Shannon-limit codes that can achieve very low bit-error rates (BER) for low signal-to-noise ratio (SNR) applications. LDPC decoding is distinguished by its potential for parallelization, low implementation complexity, low decoding latency, as well as less-severe error-floors at high SNRs. LDPC codes are considered for virtually all of the next-generation communication standards.

SUMMARY

In one embodiment, the invention is a method for decoding an encoded codeword. A first set of log-likelihood ratio (LLR) values is generated for the encoded codeword, each LLR value having a hard-decision value and a confidence value. Decoding is performed on the encoded codeword based on the first set of LLR values to generate a decoded codeword having a number b of unsatisfied check nodes (USCs). A second set of LLR values is generated for the encoded codeword, at least one LLR value having a confidence value based on the number b of USCs. Decoding is performed on the encoded codeword based on the second set of LLR values.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements.

DETAILED DESCRIPTION

Figure 1:
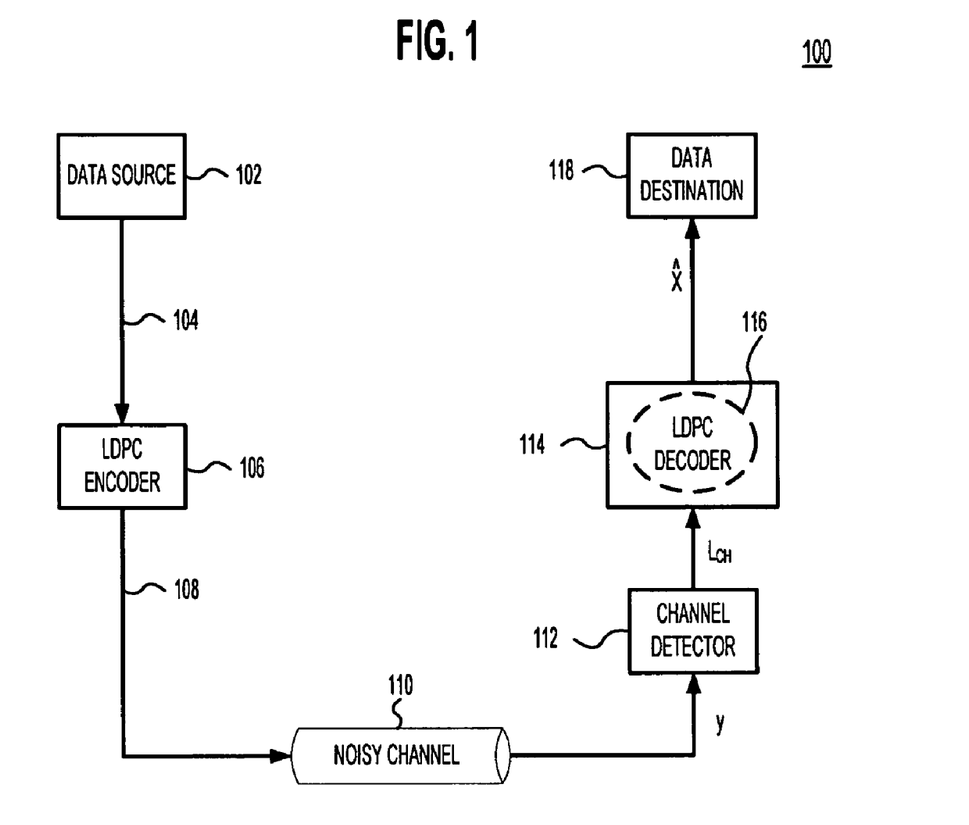
FIG. 1 is a block diagram of a communications system 100 that utilizes LDPC coding.

FIG. 1 is a block diagram of a communications system 100 that utilizes LDPC coding. Data source 102 generates a set of bits known as an original information word 104. LDPC encoder 106 encodes original information word 104 to generate codeword 108, also known as the channel input codeword. LDPC encoding is discussed in greater detail below. Encoder 106 then sends codeword 108 through noisy channel 110, e.g., a hard-drive platter.

Channel detector 112 receives codeword 108 as a set of values y from noisy channel 110. Channel detector 112 converts the received values y into a set of log-likelihood ratio (LLR) values $L_{CH}$. An LLR value comprises (i) a sign bit that represents the decoder's best guess as to the one-bit hard-decision value indicated by the corresponding value y and (ii) one or more magnitude bits that represent the decoder's confidence in the hard decision. For example, channel detector 112 might output each $L_{CH}$ value as a five-bit LLR, where the most-significant bit is a sign bit that indicates the hard decision, and the value of the four magnitude bits indicates the confidence of the hard decision. Thus, in one possible LLR scheme, an LLR value of binary 00000 indicates a hard decision of 0 with least confidence, an LLR value of binary 01111 indicates a hard decision of 0 with maximum confidence, an LLR value of binary 10001 indicates a hard decision of 1 with least confidence, and an LLR value of binary 11111 would indicate a hard decision of 1 with maximum confidence, where binary 10000 is unused.

Channel detector 112 sends the $L_{CH}$ values to LDPC decoder 114. LDPC decoder 114 then performs one or more decoding iterations 116 ("local iterations") on a set of $L_{CH}$ values to generate decoded codeword $\hat{x}$. LDPC decoder 114 terminates when either (i) LDPC decoder 114 arrives at a decoded correct codeword (DCCW), i.e., $\hat{x}$ is the same as channel input codeword 108, or (ii) LDPC decoder 114 performs a maximum allowable number of local iterations without arriving at the DCCW, i.e., LDPC decoder 114 has failed. When decoder 114 terminates, it outputs decoded codeword $\hat{x}$ to data destination 118. LDPC decoding is described in greater detail below.

LDPC Encoding

To create codeword 108, LDPC encoder 106 appends to the bits of information word 104 a number of parity bits specified by the LDPC code. The number of bits in information word 104 is denoted K. The bits in an encoded codeword are known as variable bits, and the number of those variable bits is denoted N. Thus, the number of parity bits is given by N−K.

Each parity bit in an LDPC codeword is associated with one or more other (variable or parity) bits in that codeword in a particular way as specified by the particular LDPC code, and the value assigned to a parity bit is set so as to satisfy the LDPC code. Typical LDPC codes specify that associated bits satisfy a parity-check constraint, e.g., the sum of the associated bits is an even number, i.e., sum modulo 2=0.

The LDPC Code

A particular LDPC code is defined by a two-dimensional matrix of 1s and 0s known as the parity-check matrix, or H matrix, or simply H. H is known, a priori, by both the LDPC encoder and decoder. H comprises N columns and N−K rows, i.e., a column for every bit of the codeword, and a row for every parity bit. Each 1 in H represents an association between the codeword bit of the column and the parity bit of the row. For example, a 1 at the third row, seventh column of H means that the third parity-check bit is associated with the seventh bit of the codeword. The sum modulo 2 of the value of a check bit and all variable bits associated with that check bit should be 0. A defining characteristic of typical LDPC codes is that H is "sparse," i.e., the elements of H are mostly 0s with relatively few 1s.

Figure 2:
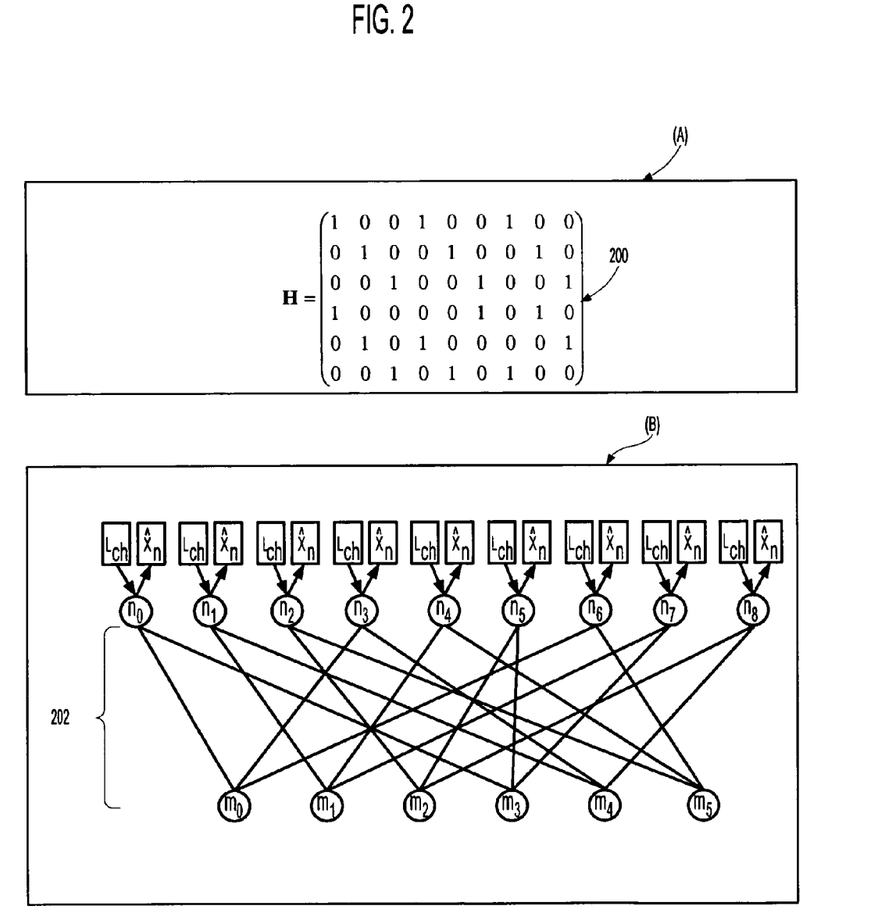
FIG. 2(A) depicts LDPC H matrix 200.
FIG. 2(B) is a Tanner graph of H matrix 200.

FIG. 2(A) depicts LDPC H matrix 200. H matrix 200 comprises N=9 columns and N−K=6 rows. Thus, H matrix 200 defines an LDPC code that accepts a three-bit information word, appends six parity bits, and outputs a nine-bit codeword.

LDPC Decoding: Belief Propagation

Figure 3:
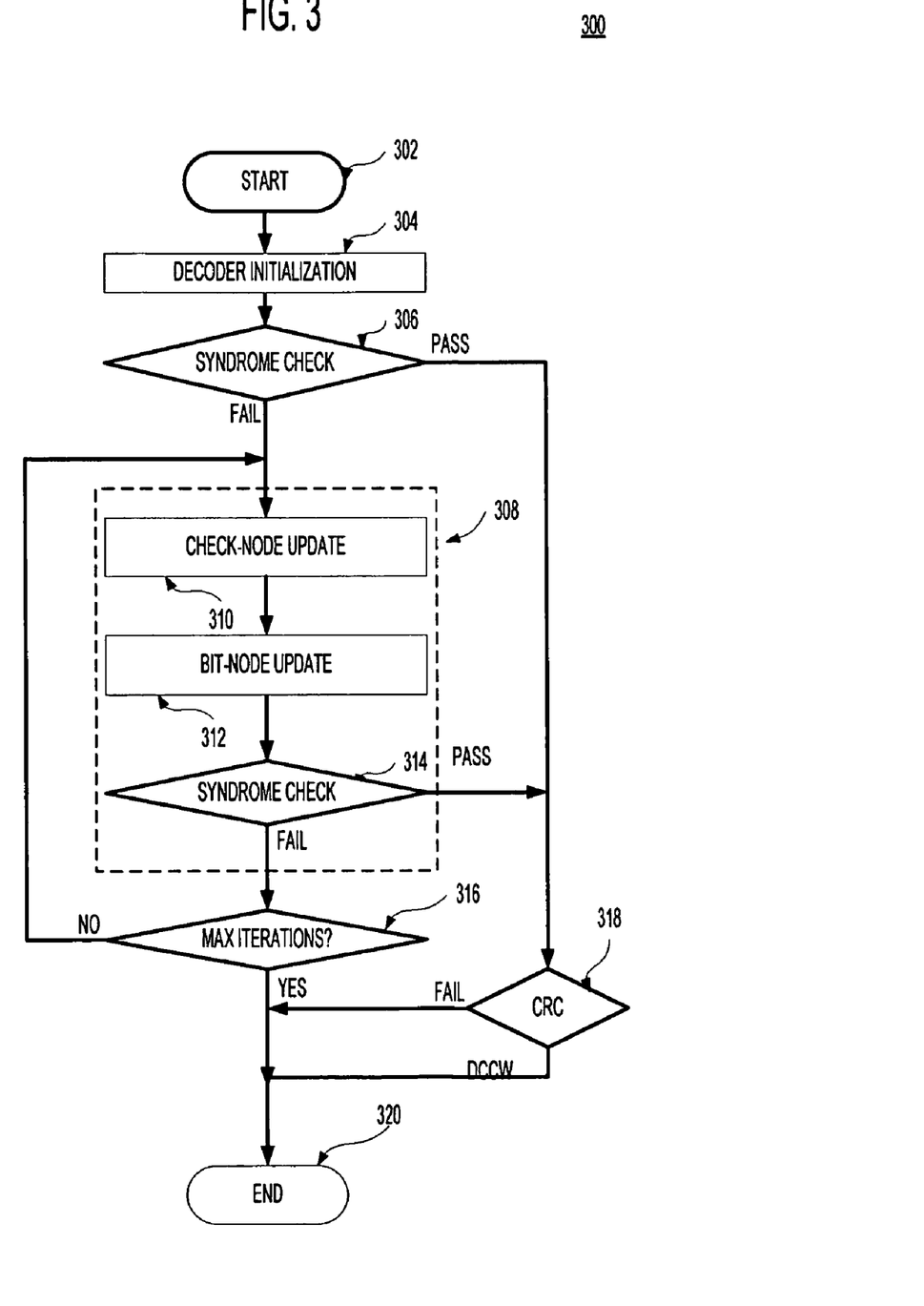
FIG. 3 is a flowchart of typical LDPC decoding method 300 used by decoder 114 of FIG. 1.

FIG. 3 is a flowchart of LDPC decoding method 300 used by decoder 114 of FIG. 1. The heart of decoding method 300 is an iterative, two-phase message-passing algorithm called belief propagation. Belief propagation can be explained with the use of a Tanner graph.

FIG. 2(B) is a Tanner graph for H matrix 200. In general, a Tanner graph comprises 1) a number of bit nodes (also known as variable nodes) n equal to the number of columns in H (and thus equal to the number N of variable bits, 2) a number of check nodes m equal to the number of rows in H (and thus equal to number of parity bits), 3) edges 202, each of which connects a single bit node $n_i$ to a single check node $m_j$, 4) for each bit node $n_i$, the original $L_{CH}$ value, and 5) for each bit node $n_i$, a calculated hard-decision output value $\hat{x}_n$. The Tanner graph of FIG. 2(B) comprises nine bit nodes $n_0$–$n_8$, six check nodes $m_0$–$m_5$, 18 edges 202 connecting bit nodes to check nodes, nine $L_{CH}$ values, and nine $\hat{x}_n$ values.

The edges in a Tanner graph represent the relationships between bit nodes n and check nodes m, where edges represent 1s in H. For example, in FIG. 2(B), an edge 202 connects first bit node $n_0$ to fourth check node $m_3$, because there is a 1 in the first column, fourth row of H matrix 200 in FIG. 2(A).

A Tanner graph is a bipartite graph, i.e., an edge can connect a bit node to only a check node, and cannot connect a bit node to another bit node, or a check node to another check node. The set of all bit nodes n connected by edges to a particular check node m is denoted N(m). The set of all check nodes m connected by edges to a particular bit node n is denoted M(n). The index of a particular (bit or check) node is its ordinal sequence in the graph.

Returning to FIG. 3, processing starts at step 302 and proceeds to step 304, decoder initialization. Decoder initialization 304 comprises setting all edges (e.g., edges 202 of FIG. 2(B)) connected to each bit node n to the corresponding $L_{CH}$ value associated with bit node n, and setting the $\hat{x}_n$ value of bit node n to the hard-decision value of bit node n's $L_{CH}$. Thus, for example, in FIG. 2(B), if the $L_{CH}$ value associated with bit node $n_0$ is the decimal value +5, then, at step 304, the two edges 202 connecting bit node $n_0$ to check nodes $m_0$ and $m_3$ are set to +5, and bit node n's $\hat{x}_n$ value is set to 1. An alternative way of expressing the first part of this step is that bit node $n_0$ sends a message of +5 to each check node m in set M($n_0$). A message sent from a bit node n to a check node m is called a bit-node or Q message, and is denoted $Q_{nm}$.

Step 304 then sends to syndrome check step 306 a candidate decoded codeword vector $\hat{x}$ comprising the N $\hat{x}_n$ values. Syndrome check step 306 calculates syndrome vector z using the following Equation (1):

$$z = \hat{x}H^T \quad (1)$$

where $H^T$ is the transpose of the H matrix. If syndrome vector z is a 0 vector, then vector $\hat{x}$ has satisfied all the parity-check constraints defined by H, i.e., $\hat{x}$ is a valid decoded codeword. In that case, processing proceeds to cyclic-redundancy check (CRC) check 318.

If, instead, syndrome vector z is not a 0 vector, then vector $\hat{x}$ fails one or more of the parity-check constraints. Each non-zero element in syndrome vector z represents a failed parity-check constraint, which is also referred to as unsatisfied check node (USC). The number of non-zero elements in syndrome vector z is the number b of USCs in vector $\hat{x}$. Further, the indices of the non-zero elements of syndrome vector z are the indices of the USCs in vector $\hat{x}$.

If vector $\hat{x}$ fails syndrome check 306, then processing continues to the first of one or more decoding iterations 308 ("local iterations"). Decoding iteration 308 comprises three steps: 1) a belief-propagation check-node update step 310, 2) a belief-propagation bit-node update step 312, and 3) a syndrome check step 314, which is identical to step 306.

In belief-propagation check-node update step 310, each check node m uses the $Q_{nm}$ messages received from all bit nodes n in set N(m) to calculate one or more check-node or R messages, denoted $R_{mn}$, according to the following Equations (2), (3), and (4):

$$R_{mn}^{(i)} = \delta_{mn}^{(i)} \max(\kappa_{mn}^{(i)} - \beta, 0) \quad (2)$$

$$\kappa_{mn}^{(i)} = |R_{mn}^{(i)}| = \min_{n' \in N(m) \setminus n} |Q_{n'm}^{(i-1)}| \quad (3)$$

$$\delta_{mn}^{(i)} = \left( \prod_{n' \in N(m) \setminus n} \mathrm{sgn}(Q_{n'm}^{(i-1)}) \right) \quad (4)$$

where i is the decoding iteration, N(m)\n is set N(m) excluding bit node n, the function sgn returns the sign of its operand, and β is a positive constant, the value of which depends on the code parameters. Each check node m sends the calculated $R_{mn}$ messages back along those same edges to all bit nodes n in set N(m).

Next, in belief-propagation bit-node update step 312, each bit node n calculates one or more $Q_{nm}$ messages according to the following Equation (5):

$$Q_{nm}^{(i)} = L_n^{(0)} + \sum_{m' \in M(n) \setminus m} R_{m'n}^{(i)} \quad (5)$$

where $L_n^{(0)}$ is the original $L_{CH}$ value for bit node n, and M(n)\m is set M(n) excluding check node m. Each bit node n then sends the calculated $Q_{nm}$ messages to all check nodes m in set M(n).

Also during bit-node update step 312, each bit node n updates its $\hat{x}_n$ value according to the following Equations (6) and (7):

$$P_n^{(i)} = \sum_{m' \in M(n)} R_{m'n}^{(i)} \quad (6)$$

-continued $$P_n = L_n^{(0)} + E_n^{(i)} \quad (7)$$

If $P_n \geq 0$, then $\hat{x}_n = 0$, and if $P_n < 0$, then $\hat{x}_n = 1$. The values generated by Equation (6) are also referred to as extrinsic or E values, and denoted $E_{LDPC}$. The values generated by Equation (7) are referred to as P values. The specific belief-propagation algorithm represented by Equations (2)-(7) is known as the min-sum algorithm. Note that the $\hat{x}_n$ values are updated during each decoding iteration 308 and finally outputted by decoding process 300. The original LLR values $L_{ch}$ remain unchanged during decoding process 300.

Bit-node update step 312 sends to syndrome check step 314 a vector $\hat{x}$ constructed out of the current $\hat{x}_n$ values of the decoder. The syndrome check of step 314 is identical to the syndrome check of step 306 discussed above. If vector $\hat{x}$ passes syndrome check 314, then vector $\hat{x}$ is sent to CRC step 318.

LDPC Decoding: Cyclic Redundancy Check and Mis-Satisfied Check Nodes

Passing syndrome check 306 or 314 means that vector $\hat{x}$ is a valid decoded codeword, but not necessarily the decoded correct codeword (DCCW). It is possible for an LDPC decoder to generate a valid decoded codeword that is not the DCCW. In that case, there are no USCs in vector $\hat{x}$, but there are mis-satisfied check nodes (MSCs), i.e., check nodes which are associated with an even number of erroneous bit nodes. Thus, to ensure that valid vector $\hat{x}$ is the DCCW, process 300 passes vector $\hat{x}$ to cyclic redundancy check (CRC) 318. A CRC check is a checksum operation that can detect alteration of data during transmission or storage.

If vector $\hat{x}$ passes the CRC check, then vector $\hat{x}$ is the DCCW, and process 300 sets global variable DCCW to true, outputs vector $\hat{x}$, and terminates at step 320. Otherwise, vector $\hat{x}$ is not the DCCW, and process 300 sets global variable DCCW to false, outputs vector $\hat{x}$, and terminates at step 320. Global variable DCCW informs other decoding processes whether or not the DCCW has been generated.

Returning to step 314, if vector $\hat{x}$ fails the syndrome check, then there exist one or more USCs. The typical method for resolving USCs is to perform another decoding iteration 308. However, in a particular local decoding session, there might exist one or more USCs that will never be satisfied in a reasonable amount of time. Thus, LDPC decoders are typically limited in how many decoding iterations they can perform. Typical values for the maximum number of iterations range from 50 to 200.

In FIG. 3, step 316 determines whether the specified maximum number of iterations has been reached. If not, then another decoding iteration 308 is performed. If, instead, the maximum number of iterations has been reached, then decoder process 300 has failed. In that case, process 300 sets global variable DCCW to false, outputs vector $\hat{x}$, and terminates at step 320.

A complete execution of process 300 is known as a local decoding session.

BER, SNR, and Error Floors

The bit-error rate (BER) of an LDPC decoder represents the probability that a decoded bit has the wrong value. Thus, for example, a decoder with a BER of $10^{-9}$ will, on average, generate one erroneous bit for every billion decoded bits. The failure of an LDPC local decoding session to converge on the DCCW contributes to the BER of the decoder.

The BER of an LDPC decoder is strongly influenced by the signal-to-noise ratio (SNR) of the decoder's input signal. A graph of BER as a function of SNR typically comprises two distinct regions: an initial "waterfall" region where the BER improves (decreases) rapidly given a unit increase in SNR, and a subsequent "error-floor" region where increases in SNR yield only modest improvements in BER. Thus, achieving significant BER improvements in the error-floor region requires methods other than SNR increase.

One method for improving the error-floor characteristics of an LDPC decoding is to increase the codeword length. However, increasing codeword length also increases the memory and other computing resources required for LDPC decoding. Thus, if such resources are strictly limited, as is typically the case with the read-channel devices on HD drives, then other methods must be found to yield the necessary error-floor improvement.

Another scarce resource is processing cycles. Typically, to achieve a specified throughput, an HD drive budgets a fixed number of read-channel processing cycles for decoding a codeword. Methods that exceed that budget (e.g., off-the-fly methods) decrease the throughput. More desirable are on-the-fly methods that recover the DCCW within the clock-cycle allotment and thus do not decrease the throughput.

Another way to improve the error-floor characteristics of an LDPC decoder is to use one or more post-processing methods. A post-processing method is invoked when a local decoding session fails to converge on the DCCW within the maximum number of iterations allowed. A post-processing method adjusts one or more variables associated with the decoding process (e.g., y values, $L_{CH}$ values, and/or the operating parameters of the decoder) and re-starts decoding. Like decoding itself, a post-processing method is often iterative, making multiple, sequential changes to the inputs to the decoding process.

In a typical LDPC local decoding session, the decoder converges on the DCCW within the first several decoding iterations. When, instead, an LDPC decoder fails to converge on the DCCW within a specified maximum number of iterations, it is typically due to one of two scenarios. In the first scenario, the input codeword contains so many bit errors, i.e., so few correct values, that the decoder is unable to correct all the bit errors, and output vector $\hat{x}$ is an invalid decoded codeword (ICW), with a large number (e.g., greater than 16) of bit errors. A typical post-processing method for handling an ICW is to request a re-send of the input codeword. Although a resend is an off-the-fly method and thus undesirable, it is typically the only reliable option for correcting an ICW.

In the second scenario, the decoded codeword possesses a small number (e.g., 16 or less) of USCs. Such a decoded codeword is known as a near codeword (NCW). Often, the USCs in an NCW form a stable configuration, known as a trapping set, which is impervious to further decoding iterations. NCWs/trapping sets have a significant impact on the error-floor characteristics of an LDPC decoder.

Turbo-Equalization

Turbo-equalization refers to a family of post-processing methods for correcting an NCW. Specifically, turbo-equalization takes one or more values generated by the decoder during decoding, and combines those values with the original LLR values in order to generate new, adjusted LLR values, which will then become the new inputs to the decoder.

In a typical turbo-equalization scheme, the $E_{LDPC}$ values of a failed decoder are combined with the original $L_{CH}$ values to create new, adjusted $L_{CH}$ values. The adjusted $L_{CH}$ values are then fed back into the decoder and decoding is re-performed. The steps of adjusting $L_{CH}$ values and re-performing decoding are known as a global iteration.

Typically, turbo-equalization is an iterative process. If the LDPC decoder fails to arrive at a DCCW with the adjusted $L_{CH}$ values, then another global iteration is performed: the adjusted $L_{CH}$ values are combined again with the new $E_{LDPC}$ values of the failed decoder and fed back into the LDPC decoder. The global iterations cease when either (i) the LDPC decoder arrives at a DCCW or (ii) the specified maximum allowable number of global iterations has been performed. The steps performed by a turbo-equalization system from the moment a new codeword is accepted for decoding to the moment the last global iteration is complete is known as a global decoding session.

More information about turbo-equalization can be found in (i) A. C. Douillard, A. Picart, M. Jézéquel, P. Dither, C. Berrou, and A. Glavieux, "Iterative correction of intersymbol interference: Turbo-equalization," *Eur. Trans. Commun.*, vol. 6, pp. 507-511, September-October 1995, and (ii) Yeap, B. L., Liew, T. H., Hamorsky, J. and Hanzo, L. B., "Comparative Study of Turbo Equalization Schemes using Convolutional, Convolutional Turbo, and Block-Turbo Codes," *IEEE Transactions on Wireless Communications*, 1 (2). pp. 266-273, both of which are herein incorporated by reference in their entirety.

Figure 4:
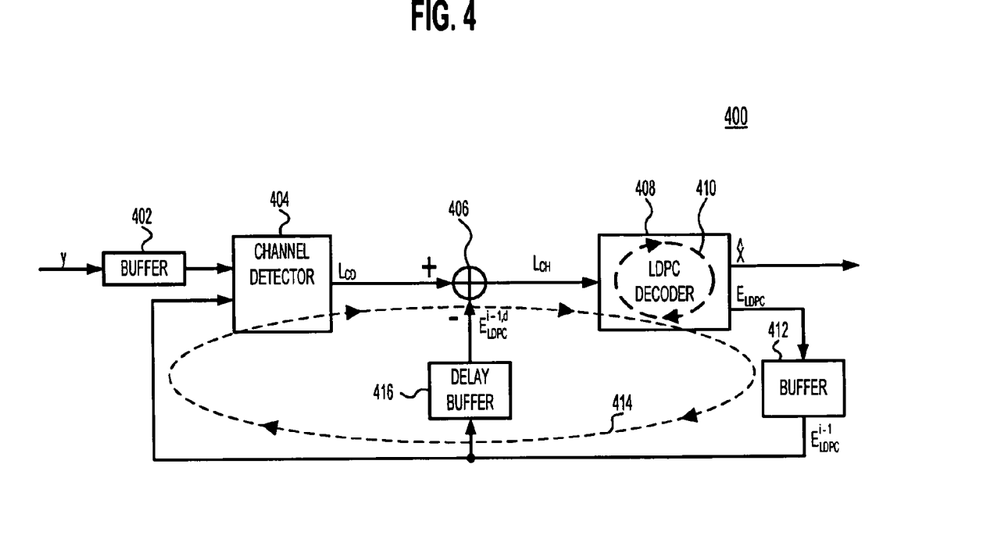
FIG. 4 is a block diagram of a turbo-equalization system 400.

FIG. 4 is a block diagram of a turbo-equalization system 400. Turbo-equalization system 400 comprises buffer 402, channel detector 404 (e.g., MAP detector, Viterbi detector, etc.), summing node 406, LDPC decoder 408, buffer 412 and delay buffer 416. Turbo-equalization system 400 is analogous to the portion of communications system 100 of FIG. 1 consisting of channel detector 112 and LDPC decoder 114.

Buffer 402 buffers equalized channel sample values y received from a noisy channel (e.g., channel 110 of FIG. 1). Channel detector 404 reads (i) a set of y samples from buffer 402 and (ii) a matching set of extrinsic information values $E_{LDPC}$ from buffer 412 ($E_{LDPC}=0$ for the first global iteration), and generates initial LLR values $L_{CD}$. Summing node 406 subtracts (i) extrinsic information values $E_{LDPC}^{i-1,d}$, received from delay buffer 416 from (ii) initial LLR values $L_{CD}$ to generate adjusted LLR values $L_{CH}$. LDPC decoder 408 performs one or more local iterations 410 using adjusted LLR values $L_{CH}$ to generate (i) codeword $\hat{x}$ and (ii) a new set of extrinsic information values $E_{LDPC}$. Extrinsic information values $E_{LDPC}$ are the LLR values generated by the LDPC decoder 408 minus adjusted LLR values $L_{CH}$ (see Equations 6 and 7). Buffer 412 stores extrinsic information values $E_{LDPC}$ for one global iteration to generate extrinsic information values $E_{LDPC}^{i-1}$. Similarly, delay buffer 416 stores and delays extrinsic information values $E_{LDPC}^{i-1}$ for several samples (the number of samples depends on the processing delay of channel detector 404) to generate extrinsic information values $E_{LDPC}^{i-1,d}$.

Each global iteration 414 comprises (i) channel detector 404 receiving values from buffers 402 and 412, and generating LLR values $L_{CD}$, (ii) summing node 406 generating a difference, (iii) LDPC decoder 408 performing a local decoding session, and (iv) buffers 412 and 416 storing and delaying corresponding sets of $E_{LDPC}$ values. Thus, in a given global iteration i, summing node 406 subtracts from initial LLR values $L_{CD}$ the $E_{LDPC}$ values generated in global iteration i−1 (i.e., $E_{LDPC}^{i-1}$ from i−1 global iteration and $E_{LDPC}^{0}=0$ for the first global iteration, i.e., i=0).

An example of the operation of system 400 is as follows. Variable superscripts refer to the global iteration to which a particular variable belongs. For example, $E_{LDPC}^{3}$ refers to the $E_{LDPC}$ values generated by decoder 408 in the third global iteration (i.e., global iteration 3).

Upon accepting a new set of y signals for decoding, system 400 initializes all of the $E_{LDPC}$ values to zero. Since $E_{LDPC}^{1}$ refers to the $E_{LDPC}$ values generated by decoder 408 in global iteration 1, during initialization, system 400 initializes to zero the values $E_{LDPC}^{0}$ (stored in buffer 412 and applied at channel detector 404 during global iteration 1) and the values $E_{LDPC}^{0,d}$ (stored in delay buffer 416 and applied at summing node 406 during global iteration 1).

In global iteration 1 of system 400, the buffered extrinsic information values $E_{LDPC}^{0}$ applied at channel detector 404 and the delayed extrinsic information values $E_{LDPC}^{0,d}$ applied at summing node 406 will be null. Thus, the adjusted LLR values $L_{CH}$ will be equal to the initial LLR values $L_{CD}$. LDPC decoder 408 performs one or more local iterations on the adjusted LLR values $L_{CH}$ and outputs new extrinsic information values $E_{LDPC}^{1}$ to buffer 412, which outputs buffered, extrinsic information values $E_{LDPC}^{1,d}$ to delay buffer 416.

If decoder 408 converges on the DCCW during global iteration 1, then LDPC decoding was successful. In that case, channel detector 404 accepts the next set of y values to decode, and delay buffers 412 and 416 are re-initialized to zero. If, on the other hand, $\hat{x}$ is not the DCCW, then system 400 starts another global iteration 414 (i.e., global iteration 2).

In global iteration 2, channel detector 404 processes the buffered y values and the buffered extrinsic information values $E_{LDPC}^{1}$ to generate new initial LLR values $L_{CD}$ to summing node 406. Summing node 406 subtracts the buffered, extrinsic information values $E_{LDPC}^{1,d}$ from the new initial LLR values $L_{CD}$ and sends the resulting adjusted LLR values $L_{CH}$ to LDPC decoder 408, where a new local decoding session is started. LDPC decoder 408 performs one or more local iterations on the adjusted LLR values $L_{CH}$ and outputs new extrinsic information values $E_{LDPC}^{2}$ to buffer 412, which outputs buffered LLR values $E_{LDPC}^{2}$ to delay buffer 416.

If decoder 408 converges on the DCCW during global iteration 2, then LDPC decoding was successful. In that case, channel detector 404 accepts the next set of y values to decode, and delay buffers 412 and 416 are re-initialized to zero. If, on the other hand, $\hat{x}$ is not the DCCW, then system 400 starts another global iteration 414 (i.e., global iteration 3).

In global iteration 3, channel detector 404 processes the buffered y values and the buffered extrinsic information values $E_{LDPC}^{2}$ to generate new initial LLR values $L_{CD}$ to summing node 406. Summing node 406 subtracts the buffered, extrinsic information values $E_{LDPC}^{2,d}$ from the new initial LLR values $L_{CD}$ and sends the resulting adjusted LLR values $L_{CH}$ to LDPC decoder 408, where a new local decoding session is started. LDPC decoder 408 performs one or more local iterations on the adjusted LLR values $L_{CH}$ and outputs new extrinsic information values $E_{LDPC}^{3}$ to buffer 412, which outputs buffered LLR values $E_{LDPC}^{3}$ to delay buffer 416.

If decoder 408 converges on the DCCW during global iteration 3, then LDPC decoding was successful. In that case, channel detector 404 accepts the next set of y values to decode, and delay buffers 412 and 415 are re-initialized to zero. If, on the other hand, $\hat{x}$ is not the DCCW, then system 400 starts another global iteration 414 (i.e., global iteration 4).

This process of global iterations continues until either the DCCW is generated or the maximum number of global iterations is reached.

Figure 5:
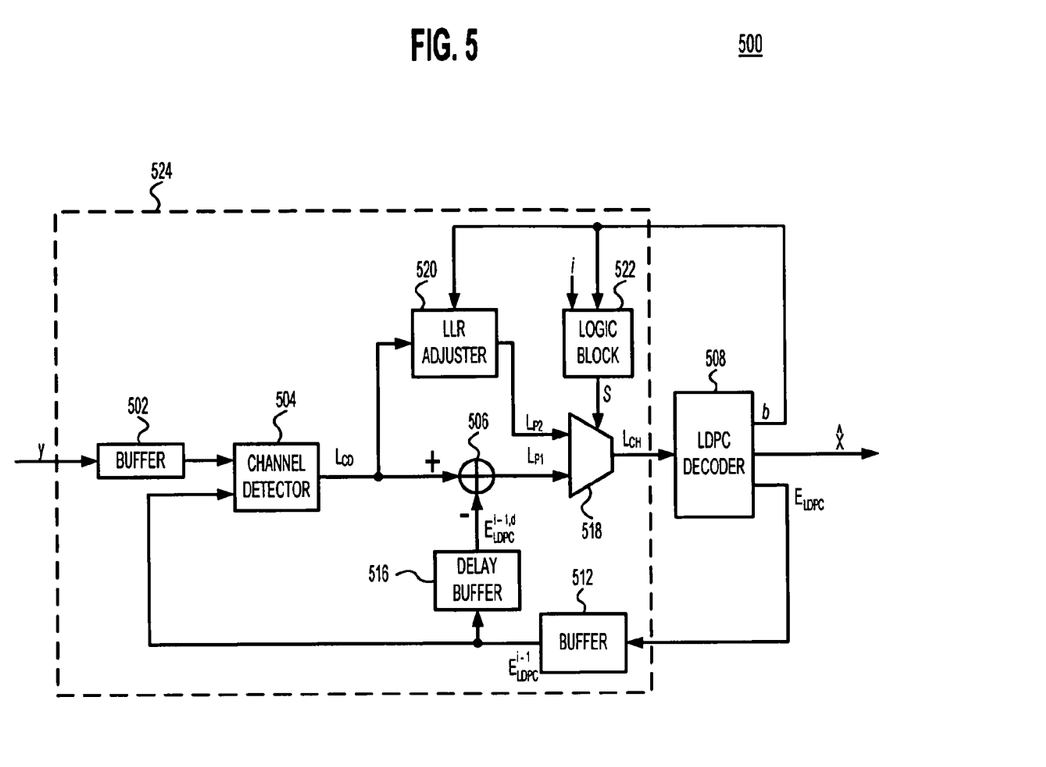
FIG. 5 is a block diagram of a turbo-equalization system 500 according to one embodiment of the present invention.

FIG. 5 is a block diagram of a turbo-equalization system 500 according to one embodiment of the present invention. Like turbo-equalization system 400 of FIG. 4, turbo-equalization system 500 is analogous to the portion of communications system 100 of FIG. 1 consisting of channel detector 112 and LDPC decoder 114. Buffer 502, channel detector 504, summing node 506, LDPC decoder 508, buffer 512, and delay buffer 516 of FIG. 5 are analogous to buffer 402, channel detector 404, summing node 406, LDPC decoder 408, and buffer 412, and delay buffer 416 of FIG. 4, respectively. In addition, turbo-equalization system 500 comprises LLR adjuster 520 and switch 518. LLR generator 524 comprises buffer 502, channel detector 504, summing node 506, switch 508, buffer 512, delay buffer 516, LLR adjuster 520, logic block 522, and switch 518.

In addition to being applied to summing node 506, initial LLR values $L_{CD}$ generated by channel detector 504 are also applied to LLR adjuster 520. Instead of being applied directly to LDPC decoder 508, the standard, adjusted LLR values $L_{P1}$ generated by summing node 506 are applied to switch 518.

LLR adjuster 520 receives (i) initial LLR values $L_{CD}$ from channel detector 504 and (ii) the number b of unsatisfied check nodes in decoded codeword $\hat{x}$ from LDPC decoder 508 from the previous local decoding session. LLR adjuster 520 calculates improved, adjusted LLR values $L_{P2}$ according to the following Equation (8):

$$L_{P2} = \text{sign}(L_i)*b, \qquad (8)$$

where the improved, adjusted LLR values $L_{P2}$ have the signs of the corresponding initial LLR values $L_{CD}$, but magnitudes equal to the previous number b of USCs. Thus, for example, if the hard decision of a particular initial LLR value $L_{CD}$ is negative, and the number b of USCs in $\hat{x}$ was 5, then $L_{P2}$ will be −5. Improved, adjusted LLR values $L_{P2}$ are then applied to switch 518.

Switch 518 receives (i) a 1-bit control signal S from logic block 522, (ii) the standard, adjusted LLR values $L_{P1}$ from summing node 506, and (iii) the improved, adjusted LLR values $L_{P2}$ from LLR adjuster 520. If S is 1, then switch 518 outputs the improved, adjusted LLR values $L_{P2}$ to LDPC decoder 508 as selected, adjusted LLR values $L_{CH}$. If S is 0, then switch 518 outputs the standard, adjusted LLR values $L_{P1}$ to LDPC decoder CF as the selected, adjusted LLR values $L_{CH}$.

Logic block 522 receives the number i of the current global decoding iteration and the value b from LDPC decoder 508. Logic block 522 outputs a 1 as control signal S if all of the following three conditions are met:

(1) b is less than or equal to $b_{max}$;
(2) i is not equal to 0 mod P; and
(3) i is greater than $i_{START}$.

$b_{max}$ indicates the maximum number of USC nodes allowed by the turbo-equalization system. A typical value for $b_{max}$ is 16. i is the ordinal number of a given global iteration. Ordinal number i is initialized to 0 and incremented at the start of each global iteration. P is an operator-defined value indicating the frequency of improved global iterations. For example, if P is four, then three improved global iterations will be performed for every standard global iteration. $i_{START}$ is the operator-defined number of initial global iterations that use standard global-iteration methods. For example, if $i_{START}$ is set to two, then the first two global iterations will be standard global iterations. If, for example, P=4 and $i_{START}$=2, then global iterations 1 and 2 will be standard global iterations, global iteration 3 will be an improved global iteration, global iteration 4 will be a standard global iteration, global iterations 5, 6, and 7 will be improved global iterations, iteration 8 will be a standard global iteration and so on, with global iterations 12, 16, 20, . . . being standard global iterations, and all other global iterations being improved global iterations.

If any one or more of the three conditions are not met, then logic block 522 outputs a 0 as control signal S.

LDPC decoder 508 receives the selected, adjusted LLR values $L_{CH}$ and performs decoding. LDPC decoder 508 outputs three sets of values: (1) a new set of extrinsic information values $E_{LDPC}^i$ to delay buffer 512, (2) a new decoded codeword $\hat{x}$ to downstream processing, and (3) number b of USCs in decoded codeword $\hat{x}$ to LLR adjuster 520 and switch 518. If LDPC decoder 508 does not converge on the DCCW, then another global iteration of system 500 is performed. System 500 terminates when either (i) LDPC decoder 508 converges on the DCCW or (ii) system 500 fails to converge on the DCCW within the maximum number of global iterations allowed.

Note that, if the frequency P of improved global iterations is set to one, then all global iterations performed by system 500 will be standard global iterations. Similarly, if the number $i_{START}$ of initial, standard global iterations is set equal to the maximum number of global iterations, then all global iterations will be standard global iterations.

Research has shown that embodiments of the present invention can yield a ten-fold improvement in the BER of an iterative decoding system.

Although the present invention has been described in the context of hard-disk drives that implement LDPC coding and decoding, the invention is not so limited. In general, the present invention can be implemented in any suitable communication path that involves LDPC coding and decoding.

Further, although the exemplary belief-propagation algorithm used above is the offset min-sum algorithm (OMS), the present invention is not so limited, and can be used with any belief-propagation variant, e.g., sum-product algorithm (SPA) or the Bahl-Cocke-Jelinek-Raviv (BCJR) algorithm.

Yet further, although the belief-propagation example used above employed a specific decoding schedule (flooding schedule) where all check nodes were updated during a single check-node update step, followed by all bit nodes being updated in a single bit-node update step, the present invention is not so limited, and can be used with any decoding schedule, e.g., row-serial schedule, column-serial schedule, and row-column serial schedule.

Yet further, although exemplary system 500 performed improved global iterations in conjunction with standard global iterations, the present invention is not so limited. For example, one embodiment of the present invention would be a system which utilizes only improved global iterations. Such a system would be analogous to system 500 of FIG. 5, but in which summing node 506, logic block 522, switch 518, and delay buffer 516 are omitted.

Yet further, although exemplary system 500 utilized three specific criteria to determine when to perform improved global iterations, the present invention is not so limited. Any suitable number and types of criteria can be utilized, including no criteria (e.g., always perform improved global iterations).

Yet further, although exemplary system 500 sets the magnitudes of the improved, adjusted LLR values equal to the number b of USCs, in alternative embodiments, the magnitudes of the improved, adjusted LLR values could be set equal to a different number based on the value of b (e.g., b+1).

Yet further, although the exemplary LDPC decoder used above was a non-layered decoder, the present invention is not so limited, and can be used with both layered and non-layered decoders.

Yet further, although embodiments of the present invention have been described in the context of LDPC codes, the present invention is not so limited. Embodiments of the present invention could be implemented for any code which can be defined by a graph, e.g., tornado codes, structured IRA codes, where graph-defined codes suffer from trapping sets.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

What is claimed is:

1. A method for decoding an encoded codeword, the method comprising:
    (a) generating a first set of log-likelihood ratio values for the encoded codeword, each log-likelihood ratio value having a hard-decision value and a confidence value;
    (b) performing decoding on the encoded codeword based on the first set of log-likelihood ratio values to generate a decoded codeword having a number b of unsatisfied check nodes;
    (c) generating a second set of log-likelihood ratio values for the encoded codeword, at least one log-likelihood ratio value having a confidence value that is a function of the number b of unsatisfied check nodes; and
    (d) performing decoding on the encoded codeword based on the second set of log-likelihood ratio values.

2. The method of claim 1, wherein the encoded codeword is a low density parity check codeword.

3. The method of claim 1, wherein each log-likelihood ratio value in the second set has a confidence value equal to the number b of unsatisfied check nodes.

4. The method of claim 1, wherein steps (c) and (d) correspond to a single iteration of a first turbo-equalization method.

5. The method of claim 4, further comprising one or more additional iterations of the first turbo-equalization method.

6. The method of claim 4, wherein steps (a) and (b) correspond to a single iteration of a second turbo-equalization method, wherein the confidence values of the log-likelihood ratio values in the first set are not based on the number b of unsatisfied check nodes from any previous decoding of the encoded codeword.

7. The method of claim 4, further comprising one or more iterations of a second turbo-equalization method comprising the steps of:
    (1) generating a third set of log-likelihood ratio values for the encoded codeword without basing any of the confidence values on the number b of unsatisfied check nodes from any previous decoding of the encoded codeword; and
    (2) performing decoding on the encoded codeword based on the third set of log-likelihood ratio values.

8. The method of claim 7, wherein the method comprises interleaving first sets of iterations of the first turbo-equalization method with second sets of iterations of the second turbo-equalization method, wherein:
    each first set comprises one or more iterations of the first turbo-equalization method; and
    each second set comprises one or more iterations of the second turbo-equalization method.

9. The method of claim 8, wherein the method comprises an initial set of one or more iterations of the second turbo-equalization method.

10. The method of claim 1, wherein step (c) comprises the steps of:
    (c1) comparing the number b of unsatisfied check nodes to a specified threshold value; and
    (c2) generating the at least one log-likelihood ratio value to have a confidence value based on the number b of unsatisfied check nodes if the number b of unsatisfied check nodes is not greater than the specified threshold value.

11. An apparatus for decoding an encoded codeword, the apparatus comprising:
    (a) means for generating a first set of log-likelihood ratio values for the encoded codeword, each log-likelihood ratio value having a hard-decision value and a confidence value;
    (b) means for performing decoding on the encoded codeword based on the first set of log-likelihood ratio values to generate a decoded codeword having a number b of unsatisfied check nodes;
    (c) means for generating a second set of log-likelihood ratio values for the encoded codeword, at least one log-likelihood ratio value having a confidence value that is a function of the number b of unsatisfied check nodes; and
    (d) means for performing decoding on the encoded codeword based on the second set of log-likelihood ratio values.

12. An apparatus for decoding an encoded codeword, the apparatus comprising:
    a log-likelihood ratio generator adapted to generate one or more sets of log-likelihood ratio values for the encoded codeword, each log-likelihood ratio value having a hard-decision value and a confidence value; and
    a decoder adapted to perform decoding on the encoded codeword based on one of the one or more sets of log-likelihood ratio values, wherein:

the log-likelihood ratio generator is adapted to generate a first set of log-likelihood ratio values for the encoded codeword;

the decoder is adapted to perform decoding on the encoded codeword based on the first set of log-likelihood ratio values to generate a decoded codeword having a number b of unsatisfied check nodes;

the log-likelihood ratio generator is adapted to generate a second set of log-likelihood ratio values for the encoded codeword, at least one log-likelihood ratio value having a confidence value that is a function of the number b of unsatisfied check nodes; and the decoder is adapted to perform decoding on the encoded codeword based on the second set of log-likelihood ratio values.

13. The apparatus of claim 12, wherein the log-likelihood ratio generator comprises:

a channel detector adapted to generate a set of channel-detector log-likelihood ratio values based on a channel output codeword; and a log-likelihood ratio adjuster adapted to generate a set of first turbo-equalization method log-likelihood ratio values based on the set of channel-detector log-likelihood ratio values and the number b of unsatisfied check nodes corresponding to a previous decoding of the encoded codeword.

14. The apparatus of claim 13, wherein the log-likelihood ratio generator further comprises:

a summation node adapted to generate a set of second turbo-equalization method log-likelihood ratio values based on the set of channel-detector log-likelihood ratio values and a set of extrinsic log-likelihood ratio values corresponding to the previous decoding of the encoded codeword; and a multiplexer adapted to select the set of first turbo-equalization method log-likelihood ratio values or the set of second turbo-equalization method log-likelihood ratio values for the decoder.

15. The apparatus of claim 12, wherein the encoded codeword is a low density parity check codeword.

16. The apparatus of claim 12, wherein the generation of the second set of log-likelihood ratio values by the log-likelihood ratio generator and the performance of decoding on the encoded codeword based on the second set of log-likelihood ratio values by the decoder correspond to a single iteration of a first turbo-equalization method.

17. The apparatus of claim 16, wherein the apparatus is adapted to perform one or more iterations of a second turbo-equalization method comprising:

the log-likelihood ratio generator generating a third set of log-likelihood ratio values for the encoded codeword without basing any of the confidence values on the number b of unsatisfied check nodes from any previous decoding of the encoded codeword; and the decode performing decoding on the encoded codeword based on the third set of log-likelihood ratio values.

18. The apparatus of claim 17, wherein the apparatus is adapted to interleave first sets of iterations of the first turbo-equalization method with second sets of iterations of the second turbo-equalization method, wherein:

each first set comprises one or more iterations of the first turbo-equalization method; and each second set comprises one or more iterations of the second turbo-equalization method.

19. The apparatus of claim 18, wherein the apparatus is adapted to implement an initial set of one or more iterations of the second turbo-equalization method.

20. The apparatus of claim 12, wherein the log-likelihood ratio generator is adapted to:

compare the number b of unsatisfied check nodes to a specified threshold value; and generate the at least one log-likelihood ratio value to have a confidence value based on the number b of unsatisfied check nodes if the number b of unsatisfied check nodes is not greater than the specified threshold value.

21. A method for decoding an encoded codeword, the method comprising:

(a) generating a first set of log-likelihood ratio values for the encoded codeword, each log-likelihood ratio value having a hard-decision value and a confidence value;

(b) performing decoding on the encoded codeword based on the first set of log-likelihood ratio values to generate a decoded codeword having a number b of unsatisfied check nodes;

(c) generating a second set of log-likelihood ratio values for the encoded codeword, at least one log-likelihood ratio value having a confidence value based on the number b of unsatisfied check nodes, wherein the confidence value of at least one log-likelihood ratio value in the second set is adjusted to be equal to the number b of unsatisfied check nodes; and (d) performing decoding on the encoded codeword based on the second set of log-likelihood ratio values.

22. An apparatus for decoding an encoded codeword, the apparatus comprising:

an log-likelihood ratio generator adapted to generate one or more sets of log-likelihood ratio values for the encoded codeword, each log-likelihood ratio value having a hard-decision value and a confidence value; and a decoder adapted to perform decoding on the encoded codeword based on one of the one or more sets of log-likelihood ratio values, wherein:

the log-likelihood ratio generator is adapted to generate a first set of log-likelihood ratio values for the encoded codeword;

the decoder is adapted to perform decoding on the encoded codeword based on the first set of log-likelihood ratio values to generate a decoded codeword having a number b of unsatisfied check nodes;

the log-likelihood ratio generator is adapted to generate a second set of log-likelihood ratio values for the encoded codeword, at least one log-likelihood ratio value having a confidence value based on the number b of unsatisfied check nodes, wherein the confidence value of at least one log-likelihood ratio value in the second set is adjusted to be equal to the number b of unsatisfied check nodes; and the decoder is adapted to perform decoding on the encoded codeword based on the second set of log-likelihood ratio values.

23. A method for decoding an encoded codeword, the method comprising:

(a) generating a first set of log-likelihood ratio values for the encoded codeword, each log-likelihood ratio value having a hard-decision value and a confidence value;

(b) performing decoding on the encoded codeword based on the first set of log-likelihood ratio values to generate a decoded codeword having a number b of unsatisfied check nodes;

(c) generating a second set of log-likelihood ratio values for the encoded codeword, at least one log-likelihood ratio value having a confidence value based on the number b of unsatisfied check nodes, wherein each log-likelihood ratio value in the second set has a confidence value equal to the number b of unsatisfied check nodes; and (d) performing decoding on the encoded codeword based on the second set of log-likelihood ratio values.

24. A method for decoding an encoded codeword, the method comprising:
(a) generating a first set of log-likelihood ratio values for the encoded codeword, each log-likelihood ratio value having a hard-decision value and a confidence value;
(b) performing decoding on the encoded codeword based on the first set of log-likelihood ratio values to generate a decoded codeword having a number b of unsatisfied check nodes;
(c) generating a second set of log-likelihood ratio values for the encoded codeword, at least one log-likelihood ratio value having a confidence value based on the number b of unsatisfied check nodes, wherein step (c) comprises the steps of:
(c1) comparing the number b of unsatisfied check nodes to a specified threshold value; and
(c2) generating the at least one log-likelihood ratio value to have a confidence value based on the number b of unsatisfied check nodes if the number b of unsatisfied check nodes is not greater than the specified threshold value; and
(d) performing decoding on the encoded codeword based on the second set of log-likelihood ratio values.

25. An apparatus for decoding an encoded codeword, the apparatus comprising:
a log-likelihood ratio generator adapted to generate one or more sets of log-likelihood ratio values for the encoded codeword, each log-likelihood ratio value having a hard-decision value and a confidence value; and
a decoder adapted to perform decoding on the encoded codeword based on one of the one or more sets of log-likelihood ratio values, wherein:

the log-likelihood ratio generator is adapted to generate a first set of log-likelihood ratio values for the encoded codeword;
the decoder is adapted to perform decoding on the encoded codeword based on the first set of log-likelihood ratio values to generate a decoded codeword having a number b of unsatisfied check nodes;
the log-likelihood ratio generator is adapted to generate a second set of log-likelihood ratio values for the encoded codeword, at least one log-likelihood ratio value having a confidence value based on the number b of unsatisfied check nodes; and
the decoder is adapted to perform decoding on the encoded codeword based on the second set of log-likelihood ratio values, wherein the log-likelihood ratio generator comprises:
a channel detector adapted to generate a set of channel-detector log-likelihood ratio values based on a channel output codeword;
a log-likelihood ratio adjuster adapted to generate a set of first turbo-equalization method log-likelihood ratio values based on the set of channel-detector log-likelihood ratio values and the number b of unsatisfied check nodes corresponding to a previous decoding of the encoded codeword;
a summation node adapted to generate a set of second turbo-equalization method log-likelihood ratio values based on the set of channel-detector log-likelihood ratio values and a set of extrinsic log-likelihood ratio values corresponding to the previous decoding of the encoded codeword; and
a multiplexer adapted to select the set of first turbo-equalization method log-likelihood ratio values or the set of second turbo-equalization method log-likelihood ratio values for the decoder.

* * * * *